(12) United States Patent
Biglarbegian et al.

(10) Patent No.: US 12,457,683 B2
(45) Date of Patent: Oct. 28, 2025

(54) EDDY CURRENT MITIGATION FOR ON-CHIP INDUCTORS

(71) Applicant: Apple Inc., Cupertino, CA (US)

(72) Inventors: Behzad Biglarbegian, San Jose, CA (US); Hongrui Wang, San Jose, CA (US); Abbas Komijani, Mountain View, CA (US); Reetika K Agarwal, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 267 days.

(21) Appl. No.: 18/303,486

(22) Filed: Apr. 19, 2023

(65) Prior Publication Data

US 2024/0357733 A1   Oct. 24, 2024

(51) Int. Cl.
*H05K 1/02*   (2006.01)
*H01P 3/08*   (2006.01)

(52) U.S. Cl.
CPC ............ *H05K 1/0243* (2013.01); *H01P 3/08* (2013.01); *H05K 2201/10015* (2013.01); *H05K 2201/1003* (2013.01); *H05K 2201/10075* (2013.01)

(58) Field of Classification Search
None
See application file for complete search history.

(56) References Cited

U.S. PATENT DOCUMENTS

| | | | |
|---|---|---|---|
| 5,485,131 A * | 1/1996 | Fajen | H01P 1/20336 333/204 |
| 6,426,680 B1 | 7/2002 | Duncan et al. | |
| 6,515,233 B1 * | 2/2003 | Labzentis | H05K 3/243 361/779 |
| 7,906,831 B2 | 3/2011 | Baumgartner et al. | |
| 8,810,455 B2 | 8/2014 | Achour et al. | |
| 8,891,223 B2 | 11/2014 | Morris, III et al. | |
| 10,292,269 B1 | 5/2019 | Mudakatte et al. | |
| 10,600,731 B2 | 3/2020 | Cheng et al. | |
| 10,643,985 B2 | 5/2020 | Cheng et al. | |
| 10,693,215 B2 | 6/2020 | Park et al. | |
| 11,165,389 B1 | 11/2021 | Komijani et al. | |

(Continued)

OTHER PUBLICATIONS

U.S. Appl. No. 17/751,482, filed May 23, 2022.

*Primary Examiner* — Timothy J Thompson
*Assistant Examiner* — John B Freal
(74) *Attorney, Agent, or Firm* — Treyz Law Group, P.C.; Michael H. Lyons

(57) ABSTRACT

An electronic device may include a transceiver with a substrate and an inductor on the substrate. A ring of ground traces may surround the inductor. Circuit components may be patterned onto the substrate overlapping the inductor, a region of the substrate surrounded by the inductor, and/or a region of the substrate between the inductor and the ring. The components may be arranged in trees with feed lines extending radially outward from a central axis. The components in each tree may be separated from the capacitors in other trees by gaps, preventing eddy currents on the trees. The components may be used to form bypass capacitors for power supply lines, a low-dropout regulator load, part of the loop filter of a phase-locked loop, or other portions of the transceiver. The components may thereby be used to convey signals while also meeting fill factor requirements associated with fabrication of the substrate.

20 Claims, 12 Drawing Sheets

(56) References Cited

U.S. PATENT DOCUMENTS

| | | | |
|---|---|---|---|
| 2002/0074620 A1* | 6/2002 | Yue | H01F 27/363 |
| | | | 257/531 |
| 2016/0007443 A1 | 1/2016 | Wu | |
| 2022/0102852 A1 | 3/2022 | Irci et al. | |
| 2022/0270811 A1 | 8/2022 | Yen et al. | |

* cited by examiner

EDDY CURRENT MITIGATION FOR ON-CHIP INDUCTORS

FIELD

This disclosure relates generally to electronic devices and, more particularly, to electronic devices with wireless circuitry.

BACKGROUND

Electronic devices are often provided with wireless communications capabilities. An electronic device with wireless communications capabilities has wireless communications circuitry that conveys radio-frequency signals using one or more antennas.

The wireless communications circuitry can include one or more inductors that are used in conveying radio-frequency signals. The inductors can be patterned onto a substrate. In practice, inductors occupy significant area on the substrate. This can make it challenging to fabricate the substrate and to form other components in the wireless communications circuitry.

SUMMARY

An electronic device may include wireless circuitry. The wireless circuitry may include transceiver circuitry that conveys radio-frequency signals over an antenna. The transceiver circuitry may include a substrate. The transceiver circuitry may include inductors formed from conductive traces patterned onto the substrate. A given inductor may extend from a first terminal to a second terminal around a central axis. A ring of ground traces may surround the inductor on the substrate.

Capacitors may be patterned onto the substrate overlapping the inductor, a region of the substrate surrounded by the inductor, and/or a region of the substrate between the inductor and the ring of ground traces. The capacitors may be arranged in trees (e.g., in a fishbone layout). Each tree may have corresponding feed lines. The capacitors in each tree may be coupled in parallel between the feed lines of the tree. The capacitors may be arranged in branches extending from opposing sides of the feed lines. The feed lines may extend radially outward from the central axis. The capacitors in each tree may be separated from the capacitors in other trees by gaps. The feed lines may overlap portions of the inductor opposite or orthogonal to the terminals of the inductor. Arranging the capacitors in this way may serve to minimize eddy currents in the metallization layers used to form the capacitors, thereby optimizing performance of the inductor. The capacitors may be replaced with any desired circuit components.

The inductor may be used to in a voltage-controlled oscillator (VCO) of the transceiver or in other portions of the wireless circuitry. The capacitors (or other circuit components) may be used to form bypass capacitors for power supply lines, a low-dropout regulator load, part of the loop filter of a phase-locked loop, or other portions of the wireless circuitry. The capacitors (or other circuit components) may thereby be used in the conveyance of radio-frequency signals while also meeting metal fill factor requirements associated with fabrication of the substrate.

An aspect of the disclosure provides an electronic device. The electronic device can include a transceiver configured to convey radio-frequency signals and having a substrate. The electronic device can include an inductor layered on the substrate and extending around a first region of the substrate. The electronic device can include a ring of ground traces on the substrate and extending around the inductor and a second region of the substrate, the ring of ground traces being laterally separated from the inductor by the second region of the substrate. The electronic device can include first capacitors layered on the substrate and overlapping the second region of the substrate.

An aspect of the disclosure provides a radio-frequency transceiver configured to convey radio-frequency signals. The radio-frequency transceiver can include a substrate. The radio-frequency transceiver can include an inductor on the substrate and laterally extending around a region of the substrate. The radio-frequency transceiver can include a feed line on the substrate and overlapping the inductor and the region of the substrate, the feed line extending radially away from a central axis of the inductor. The radio-frequency transceiver can include circuit components on the substrate and overlapping the region of the substrate, the circuit components being coupled to the feed line and being arranged in branches extending from opposing sides of the feed line.

An aspect of the disclosure provides an electronic device. The electronic device can include a transceiver configured to convey radio-frequency signals and having a substrate. The electronic device can include an inductor on the substrate and laterally extending around a central axis from a first terminal to a second terminal. The electronic device can include a first tree of circuit components on the substrate and arranged in branches extending from opposing sides of a first feed line, the first feed line extending radially away from the central axis at a first angle. The electronic device can include a second tree of circuit components on the substrate and arranged in branches extending from opposing sides of a second feed line, the second feed line extending radially away from the central axis at a second angle that is different from the first angle.

DETAILED DESCRIPTION

Figure 1:
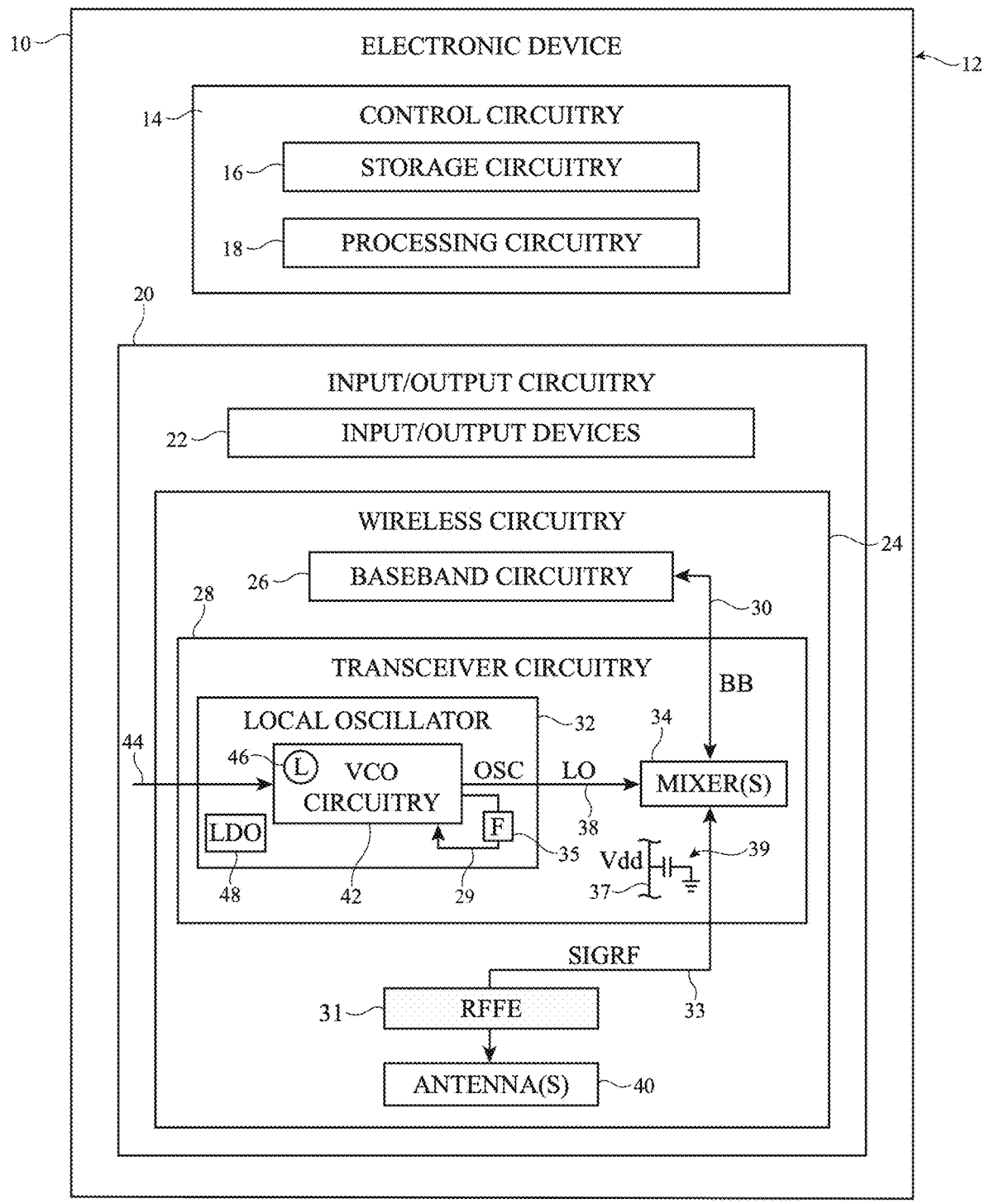
FIG. 1 is a functional block diagram of an illustrative electronic device having wireless circuitry with inductors in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 may include baseband circuitry such as baseband circuitry 26 (e.g., one or more baseband processors and/or other circuitry that operates at baseband), radio-frequency (RF) transceiver circuitry 28 (e.g., one or more transceivers or radios), radio-frequency front end (RFFE) circuitry such as front end circuitry 31, and one or more antennas 40. If desired, wireless circuitry 24 may include multiple antennas 40 that are arranged into a phased antenna array (sometimes referred to as a phased array antenna) that conveys radio-frequency signals within a corresponding signal beam that can be steered in different directions.

Baseband circuitry 26 may be coupled to transceiver circuitry 28 over one or more baseband data paths 30. Baseband circuitry 26 may include, for example, modulators (encoders) and demodulators (decoders) that operate on baseband signals. Transceiver circuitry 28 may be coupled to antennas 40 over one or more radio-frequency transmission line paths 33. Front end circuitry 31 may be disposed on radio-frequency transmission line path(s) 33 between transceiver circuitry 28 and antennas 40.

In the example of FIG. 1, wireless circuitry 24 is illustrated as including only a single transceiver and a single radio-frequency transmission line path for the sake of clarity. In general, wireless circuitry 24 may include any desired number of transceivers, any desired number of radio-frequency transmission line paths, and any desired number of antennas. Each transceiver may be coupled to one or more antennas over respective radio-frequency transmission line paths. Each radio-frequency transmission line path may have respective front end circuitry 31 disposed thereon. If desired, front end circuitry 31 may be shared by multiple radio-frequency transmission line paths.

Radio-frequency transmission line path 33 may be coupled to antenna feeds on one or more antenna 40. Each antenna feed may, for example, include a positive antenna feed terminal and a ground antenna feed terminal. Radio-frequency transmission line path 33 may have a positive transmission line signal path that is coupled to the positive antenna feed terminal and may have a ground transmission line signal path that is coupled to the ground antenna feed terminal. This example is merely illustrative and, in general, antennas 40 may be fed using any desired antenna feeding scheme.

Radio-frequency transmission line path 33 may include transmission lines that are used to route radio-frequency antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 33 may be integrated into rigid and/or flexible printed circuit boards. In one embodiment, radio-frequency transmission line paths such as radio-frequency transmission line path 33 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Front end circuitry 31 may include radio-frequency front end components that operate on radio-frequency signals conveyed over radio-frequency transmission line path 33. If desired, the radio-frequency front end components may be formed within one or more radio-frequency front end modules (FEMs). Each FEM may include a common substrate such as a printed circuit board substrate or integrated circuit substrate (e.g., one or more integrated circuit chips) for the radio-frequency front end components in the FEM. The radio-frequency front end components in front end circuitry 31 may include switching circuitry (e.g., one or more radio-frequency switches), radio-frequency filter circuitry (e.g., low pass filters, high pass filters, notch filters, band pass filters, multiplexing circuitry, duplexer circuitry, diplexer circuitry, triplexer circuitry, etc.), impedance matching circuitry (e.g., circuitry that helps to match the impedance of antennas 40 to the impedance of radio-frequency transmission line path 33), antenna tuning circuitry (e.g., networks of capacitors, resistors, inductors, and/or switches that adjust the frequency response of antennas 40), radio-frequency amplifier circuitry (e.g., power amplifier circuitry and/or low-noise amplifier circuitry), radio-frequency coupler circuitry, charge pump circuitry, power management circuitry, digital control and interface circuitry, phase shifter circuitry, and/or any other desired circuitry that operates on the radio-frequency signals transmitted and/or received by antennas 40.

While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband circuitry 26 and/or portions of transceiver circuitry 28 may form a part of control circuitry 14.

Antennas 40 may be formed using any desired antenna structures. For example, antennas 40 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Parasitic elements may be included in antennas 40 to adjust antenna performance.

Filter circuitry, switching circuitry, impedance matching circuitry, and other circuitry may be interposed within radio-frequency transmission line path 33, may be incorporated into front end circuitry 31, and/or may be incorporated into antennas 40 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antennas 40 over time.

Wireless circuitry 24 may transmit and/or receive wireless signals within corresponding frequency bands of the electromagnetic spectrum (sometimes referred to herein as communications bands or simply as "bands"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHZ), a 5 GHZ WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications (NFC) frequency bands (e.g., at 13.56 MHZ), satellite navigation frequency bands (e.g., a GPS band from 1565 to 1610 MHZ, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

In general, transceiver circuitry 28 may cover (handle) any suitable communications (frequency) bands of interest. The transceiver circuitry may convey radio-frequency signals using antennas 40 (e.g., antennas 40 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 40 may transmit the radio-frequency signals by radiating the radio-frequency signals into free space (or to free space through intervening device structures such as a dielectric cover layer). Antennas 40 may additionally or alternatively receive the radio-frequency signals from free space (e.g., through intervening devices structures such as a dielectric cover layer). The transmission and reception of radio-frequency signals by antennas 40 each involve the excitation or resonance of antenna currents on an antenna resonating element in the antenna by the radio-frequency signals within the frequency band(s) of operation of the antennas.

In examples where multiple antennas 40 are arranged in a phased antenna array, each antenna 40 may form a respective antenna element of the phased antenna array. Conveying radio-frequency signals using the phased antenna array may allow for greater peak signal gain relative to scenarios where individual antennas 40 are used to convey radio-frequency signals. In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. In scenarios where millimeter or centimeter wave frequencies are used to convey radio-frequency signals, a phased antenna array may convey radio-frequency signals over short distances that travel over a line-of-sight path. To enhance signal reception for millimeter and centimeter wave communications, the phased antenna array may convey radio-frequency signals using beam steering techniques (e.g., schemes in which antenna signal phase and/or magnitude for each antenna in an array are adjusted to perform beam steering).

For example, each antenna 40 in the phased antenna array may be coupled to a corresponding phase and magnitude controller in front end circuitry 31. The phase and magnitude controllers may adjust the relative phases and/or magnitudes of the radio-frequency signals that are conveyed by each of the antennas 40 in the phased antenna array. The wireless signals that are transmitted or received by the phased antenna array in a particular direction may collectively form a corresponding signal beam. The signal beam may exhibit a peak gain that is oriented in a particular pointing direction at a corresponding pointing angle (e.g., based on constructive and destructive interference from the combination of signals from each antenna in the phased antenna array). Control circuitry 14 may adjust the phase and magnitude controllers to change the direction of the signal beam over time (e.g., to allow device 10 to continue to communicate with external equipment even if the external equipment moves relative to device 10 over time). This example is merely illustrative and, in general, antennas 40 need not be arranged in a phased antenna array.

In performing wireless transmission, baseband processor 26 may provide baseband signals BB to transceiver circuitry 28 over baseband data path 30. Transceiver circuitry 28 may include circuitry for converting the baseband signals BB received from baseband processor 26 into corresponding radio-frequency signals. For example, transceiver circuitry 28 may include mixer circuitry such as one or more mixers 34 that up-convert baseband signals BB to radio frequencies (e.g., that modulate baseband signals BB onto one or more carriers) prior to transmission over antenna(s) 40 (e.g., as radio-frequency signals SIGRF). Transceiver circuitry 28 may also include digital-to-analog converter (DAC) and/or analog-to-digital converter (ADC) circuitry for converting signals between digital and analog domains (not shown in FIG. 1 for the sake of clarity). Antenna(s) 40 may transmit radio-frequency signals SIGRF to external wireless equipment by radiating the radio-frequency signals into free space.

In performing wireless reception, antenna(s) 40 may receive radio-frequency signals SIGRF from the external wireless equipment. The received radio-frequency signals SIGRF may be conveyed to transceiver circuitry 28 via radio-frequency transmission line path 33. Transceiver circuitry 28 may include circuitry that converts the received radio-frequency signals into corresponding baseband signals. For example, transceiver circuitry 28 may use one or more mixers 34 to down-convert the received radio-frequency signals SIGRF to baseband frequencies prior to conveying the received signals to baseband processor 26 over baseband data path 30 (e.g., as baseband signals BB).

In order to perform up-conversion, mixer(s) 34 may mix a carrier or local oscillator (LO) signal such as local oscillator signal LO received over path 38 with an input signal such as baseband signals BB. If desired, local oscillator signal LO may include multiple local oscillator signals that are provided to different mixers 34 for up-converting to different frequencies. For example, local oscillator signal LO may include a radio-frequency local oscillator (RFLO) signal for upconverting signals from baseband to radio frequencies or for upconverting signals from intermediate frequencies (IF) to radio frequencies (e.g., as radio-frequency signals SIGRF). In examples where intermediate frequencies are used, local oscillator signal LO may also include an intermediate frequency local oscillator (IFLO) signal for upconverting signals from baseband to the intermediate frequencies. In examples where the radio frequencies are greater than 10 GHZ (e.g., more than 20 GHz, more than 30 GHZ, etc.), the intermediate frequencies may be between about 100 MHz and 10 GHz, as an example. Use of intermediate frequencies in scenarios where the radio frequencies are greater than 10 GHz may allow the signals to be conveyed across relatively large distances within device 10 with minimal signal attenuation, as high frequencies such as frequencies over 10 GHz are particularly susceptible to attenuation. Similarly, in order to perform down-conversion, mixer(s) 34 may mix local oscillator signal LO with an input signal such as radio-frequency signals SIGRF to generate intermediate frequency signals or baseband signals BB.

Transceiver circuitry 28 may include local oscillator circuitry such as local oscillator 32 that produces local oscillator signals LO. In an implementation that is described herein as an example, local oscillator 32 may include voltage-controlled oscillator circuitry such as voltage-controlled oscillator (VCO) circuitry 42. VCO circuitry 42 may output periodic signals on path 38, sometimes referred to herein as VCO output signals OSC, based on a control voltage $V_{CTRL}$ received over control path 44 (e.g., from control circuitry 14). Local oscillator 32 may generate local oscillator signals LO based on VCO output signals OSC. For example, local oscillator 32 may include a phase-locked loop (PLL) 29, a low-dropout (LDO) regulator 48, a frequency-locked loop, a self-injection locking loop, digital flip-flops, buffer circuits, and/or any other desired circuitry (e.g., clocking circuitry) that produces local oscillator signals LO based on the VCO output signals OSC generated by VCO circuitry 42. PLL 29 may couple an output of VCO circuitry 42 to an input of VCO circuitry 42 and may include one or more loop filters (F) 35. Loop filters 35 may include inductors, capacitors, resistors, and/or any other desired filter components. The example of FIG. 1 is merely illustrative. VCO circuitry 42 need not be formed as a part of local oscillator 32. In general, VCO output signals OSC may be used to perform any desired functions for device 10 that otherwise require VCO output signals such as VCO output signals OSC. Control voltage $V_{CTRL}$ may be used to control the frequency of VCO output signals OSC and thus the frequency of local oscillator signals LO (e.g., for controlling mixer(s) 34 to down-convert or up-convert input signals to desired frequencies).

As shown in FIG. 1, the components of transceiver circuitry 28 may be powered by one or more power supply lines 37. Power supply lines 37 may provide one or more reference or power supply voltages Vdd that power components of transceiver circuitry 28 (e.g., components of local oscillator 32, VCO circuitry 42, mixers 34, etc.). If desired, one or more bypass capacitors 39 may couple power supply lines 37 to ground or another reference voltage (e.g., to reduce noise). While power supply lines 37 are illustrated within transceiver circuitry 28 in FIG. 1 for the sake of clarity, power supply lines 37 may also be used to power components on front end circuitry 31, baseband circuitry 26, and/or other portions of wireless circuitry 24 or device 10.

Wireless circuitry 24 may include one or more inductors 46. Each inductor 46 may be formed from one or more loops or coils of conductive material (e.g., patterned metal traces) on a corresponding substrate in wireless circuitry 24. The substrate may be a printed circuit substrate (e.g., a rigid or flexible printed circuit board substrate), a semiconductor substrate (e.g., an integrated circuit chip), an integrated circuit package substrate, a ceramic substrate, a plastic substrate, a glass substrate, a dielectric substrate, or other substrates. The substrate may be a multi-layer substrate having multiple stacked layers of substrate material. If desired, the inductor may be disposed on a single layer of the substrate material or may be distributed across multiple layers of the substrate material (e.g., coupled together using conductive vias extending through the layers). Inductors 46 may therefore sometimes be referred to herein as on-chip inductors 46 or on-substrate inductors 46. Unlike surface mount technology (SMT) inductors, which are formed from windings or coils of wire soldered to conductive contact pads on a substrate, on-chip inductors such as inductors 46 are layered, etched, disposed, deposited, or patterned directly onto the substrate (e.g., are substantially planar and extend parallel to the lateral surface of the substrate).

As one example, inductors 46 may be patterned onto a substrate of transceiver circuitry 28 (e.g., a radio chip or substrate). As shown in FIG. 1, VCO circuitry 42 may include one or more inductors 46. Inductors 46 may be used to generate VCO output signals OSC and thus local oscillator signal LO used by transceiver circuitry 28 in transmitting and/or receiving radio-frequency signals.

Figure 2:
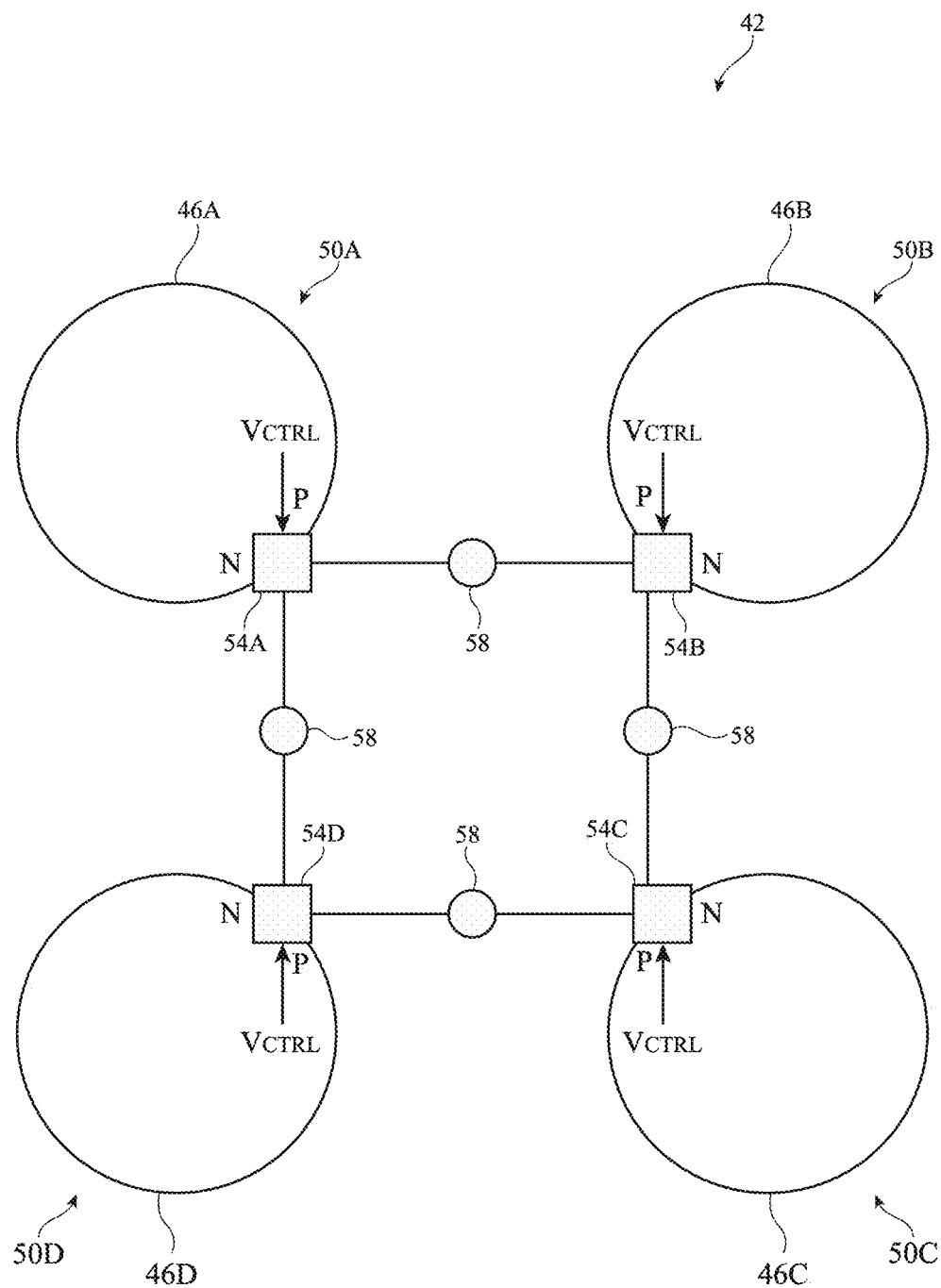
FIG. 2 is a diagram showing how illustrative inductors may be implemented in voltage controlled oscillator (VCO) circuitry in accordance with some embodiments.

FIG. 2 is a diagram showing one particular example of how inductors 46 may be implemented in VCO circuitry 42. This is illustrative and non-limiting. Additionally or alternatively, inductors 46 may form part of mixers 34, may form part of matching circuitry or amplifier circuitry for transceiver circuitry 28, may form part of a transformer on transceiver circuitry 28, or may form part of any other components of transceiver circuitry 28 for use in transmitting and/or receiving radio-frequency signals. Additionally or alternatively, inductors 46 may be patterned onto a substrate of front end circuitry 31 and may be used to form matching circuitry, tuning circuitry, power distribution circuitry, transformer circuitry, power distribution circuitry, or any other desired components of front end circuitry 31 for use in conveying radio-frequency signals. More generally, inductors 46 need not be used in conveying radio-frequency signals for wireless circuitry 24 and may be any desired on-chip inductors within device 10 and on an underlying substrate (e.g., in wireless circuitry 24, on a main logic board or motherboard of device 10, as part of control circuitry 14, as part of one or more input/output devices 22, etc.).

If desired, VCO circuitry 42 may include multiple voltage-controlled oscillators (VCOs) 50. Each VCO 50 may have a respective inductor 46. Forming VCO circuitry 42 with multiple VCOs 50 may serve to extend the total frequency range producible by mixer(s) 34 relative to scenarios where the VCO circuitry includes only a single VCO. In the example of FIG. 2, VCO circuitry 42 includes four VCOs 50. In general, VCO circuitry 42 may include any desired number of one or more VCOs 50 (e.g., two VCOs, six VCOs, more than six VCOs, etc.).

As shown in FIG. 2, VCO circuitry 42 may include four VCOs 50 such as a first VCO 50A, a second VCO 50B, a third VCO 50C, and a fourth VCO 50D. Each VCO 50 may be formed on a common substrate. Each VCO 50 may include a corresponding VCO core 54 having a first terminal N and a second terminal P. VCO circuitry 42 may have tap points (output terminals) at each of the terminals N and P of VCO cores 54A, 54B, 54C, and 54D (e.g., for outputting VCO output signals OSC of FIG. 1). Each VCO core 54 may receive control voltage $V_{CTRL}$ for tuning the frequency of VCO output signals OSC. Terminals N and P may be, for example, respective negative and positive signal terminals of the VCO cores. In this example, VCO output signals OSC may be differential signals formed from a differential signal pair output that is output from VCO circuitry 42 at terminals N and P (e.g., where the differential signal pair includes a negative signal output at terminal N and a corresponding positive signal output at terminal P).

Each VCO 50 may also include a respective inductor 46 that is coupled between terminals N and P of the corresponding VCO core 54. Each inductor 46 can have one or more loops or coils of conductive material such as conductive traces on the underlying substrate. For example, VCO 50A may have an inductor 46A coupled between terminals N and P of VCO core 54A, VCO 50B may have an inductor 46B coupled between terminals N and P of VCO core 54B, VCO 50C may have inductor 46C coupled between terminals N and P of VCO core 54C, etc. Current may run around inductors 46 while VCO circuitry 42 generates VCO output signals OSC.

VCO circuitry 42 may have circuitry 58 that couples VCO core 54A to VCO core 54D, that couples VCO core 54A to VCO core 54B, that couples VCO core 54B to VCO core 54C, and that couples VCO core 54D to VCO core 54C. Circuitry 58 may include switching circuitry and capacitors, as one example. If desired, control circuitry 14 (FIG. 1) may provide switch control signals to the switching circuitry to switch VCO circuitry 42 between different operating modes (e.g., operating modes in which current flows in different directions on the inductors). Each VCO core 54 may include cross-coupled transistors $M_1$ and $M_2$, one or more varactors, switched capacitors, and/or other circuitry. Control voltage $V_{CTRL}$ may, for example, be provided to varactors in VCO cores 54 to control (fine-tune) the frequency of the VCO output signals OSC produced on terminals P and N. The example of FIG. 2 is illustrative and non-limiting. In general, VCO circuitry 42 may have other circuit architectures. VCO circuitry 42 may include any desired number of VCOs (e.g., one VCO, two VCOs, three VCOs, more than four VCOs, etc.). Inductors 46 may be implemented in any other desired circuitry on device 10.

Figure 3:
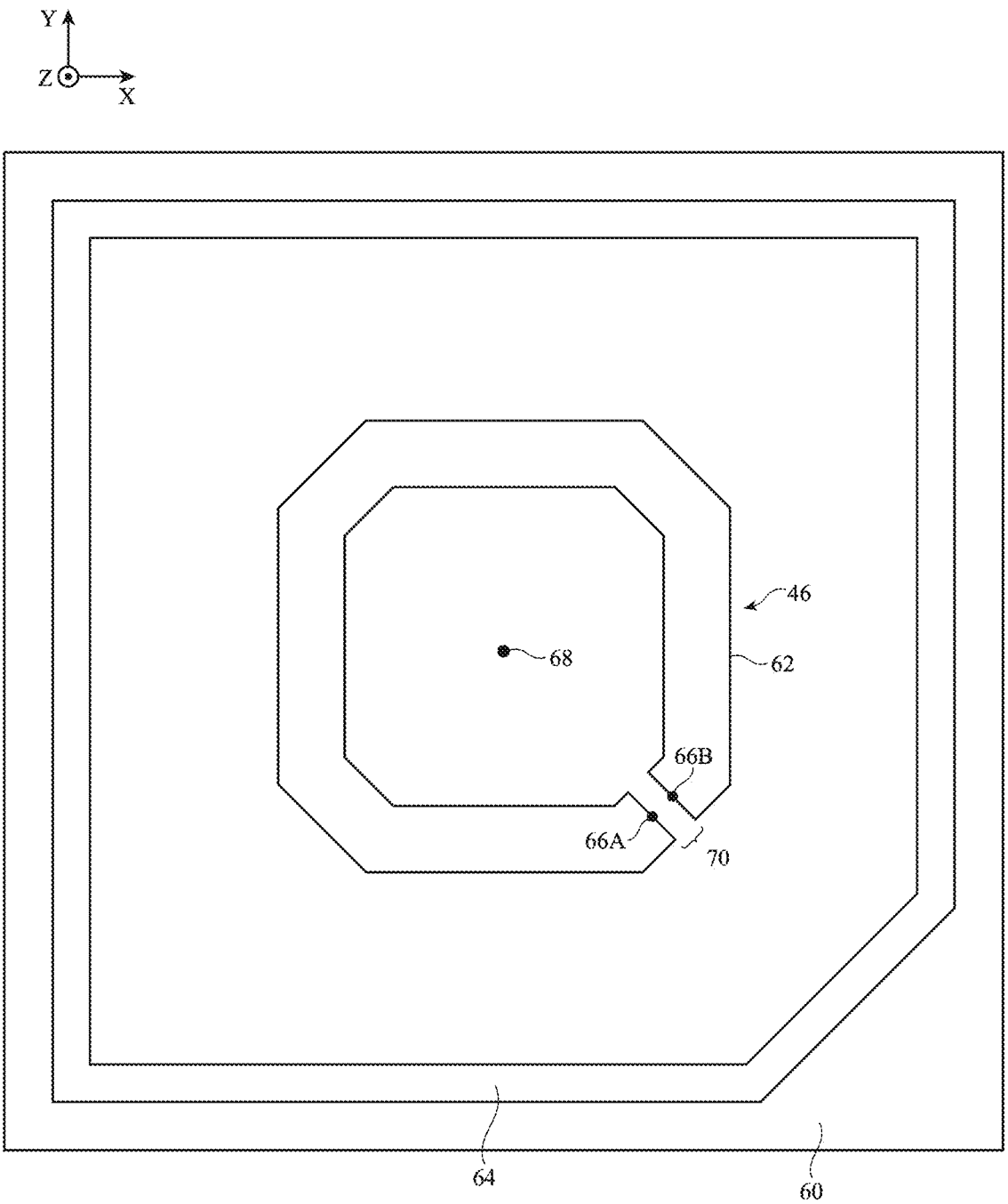
FIG. 3 is a layout diagram of an illustrative inductor on a substrate in accordance with some embodiments.

FIG. 3 is a top-down layout diagram showing how a given inductor 46 may be disposed on an underlying substrate. Inductor 46 may be an inductor of a corresponding VCO 50 in VCO circuitry 42 (FIG. 2) or may be any other desired on-chip inductor in device 10. As shown in FIG. 3, inductor 46 may be formed from conductive traces 62 disposed on substrate 60. Substrate 60 may be a printed circuit substrate (e.g., a rigid or flexible printed circuit board substrate), a semiconductor substrate (e.g., an integrated circuit chip), an integrated circuit package substrate, a ceramic substrate, a plastic substrate, a glass substrate, a dielectric substrate, or other substrates. If desired, substrate 60 may include multiple layers of substrate material (laterally extending parallel to the X-Y plane) that are stacked on top of each other (e.g., along the Z-axis).

Conductive traces 62 may laterally extend within the X-Y plane. Conductive traces 62 may be coupled between terminals 66A and 66B (e.g., inductor 46 may extend from terminal 66A to terminal 66B). Terminals 66A and 66B may be laterally separated by gap 70. Conductive traces 62 and thus inductor 46 may laterally wrap or wind around a central opening (e.g., around central axis 68, which extends parallel to the Z-axis). While inductor 46 is illustrated in FIG. 3 as including only a single turn or winding around central axis 68 for the sake of clarity, in general inductor 46 may turn or wind around central axis 68 any desired number of times (e.g., once, twice, 1.5 times, three times, more than once, more than twice, half a turn, etc.). During operation, current may flow through conductive traces 62 from terminal 66A to terminal 66B or vice versa. The current may produce a magnetic field around inductor 46. Conversely, magnetic fields may produce currents on inductor 46.

Conductive traces 62 may be confined to a single plane (e.g., may be formed from a single metallization layer on a single layer of substrate 60) or may be distributed across multiple planes (e.g., may be formed from multiple metallization layers on multiple layers of substrate 60). In implementations where conductive traces 62 are distributed across multiple planes, conductive vias may extend through one or more layers of substrate 60 to couple the conductive traces on different layers together. Distributing the conductive traces across multiple layers may allow inductor 46 to have one or more crossover points where the windings or coils of conductive traces 62 cross over each other without contacting each other. This may, for example, serve to extend the overall length of inductor 46 while minimizing the lateral footprint of the inductor, thereby allowing the inductor to exhibit a desired inductance while conserving space on substrate 60. In general, conductive traces 62 may follow any desired loop path around central axis 68 (e.g., having any desired number of curved and/or straight segments with any desired number of curved and/or straight edges extending different angles with respect to each other).

A ring of conductive ground traces such as ground traces 64 may be patterned onto substrate 60. Ground traces 64 may laterally surround inductor 46 and may have any desired shape. Ground traces 64 may be laterally separated from the outer edges of inductor 46 by a non-zero distance. If desired, ground traces 64 may be patterned on two or more layers of substrate 60. In these examples, conductive vias may couple the ground traces on each of the layers together. Ground traces 64 may be held at a reference potential and may help to electromagnetically shield inductor from other components. Ground traces 64 therefore may sometimes be referred to herein as shielding traces 64.

In practice, implementing conductive traces 62 using a thick metal layer (e.g., on a top surface of substrate 60) and minimizing the presence of other metal layers under and around inductor 46 may serve to maximize the Q-factor of inductor 46. However, at least a minimum density of metal material on substrate 60 (per unit area) may be required to ensure satisfactory fabrication of substrate 60 and its on-chip inductor(s). For example, fabrication equipment may have minimum metal density rules or fill factor requirements that require at least a certain amount of metal material per unit area for the successful fabrication of the substrate (e.g., while ensuring the substrate meets minimum requirements on mechanical integrity, strength, tolerance, and robustness).

To meet these fill factor requirements, in some implementations, floating metal pads (dummy pads) are patterned onto substrate 60 (e.g., on a different layer of substrate 60 than inductor 46). The floating metal pads may overlap the portion of substrate 60 between inductor 46 and ground traces 64, inductor 46, and/or the area of substrate 60 laterally surrounded by inductor 46. While such floating metal pads may serve to meet fill factor requirements for the fabrication of substrate 60, the floating metal pads are not connected or communicably coupled to any other device components, do not contribute to the transmission or reception of radio-frequency signals, and represent wasted substrate area that could be used for other purposes.

As such, the floating metal pads may be replaced with capacitors that are communicably coupled to other device components and that are used by device 10 for additional purposes beyond meeting the fill factor requirements of substrate 60. The capacitors may, for example, form a part of wireless circuitry 24 and may be used in the transmission and/or reception of radio-frequency signals. By replacing the floating metal pads with capacitors (or other utilized circuit components), the capacitors need not be implemented elsewhere in device 10, thereby minimizing space consumption in device 10 and/or allowing space in device 10 for other components. At the same time, the metal material in the capacitors may allow substrate 60 to meet its corresponding fill factor requirements.

Figure 4:
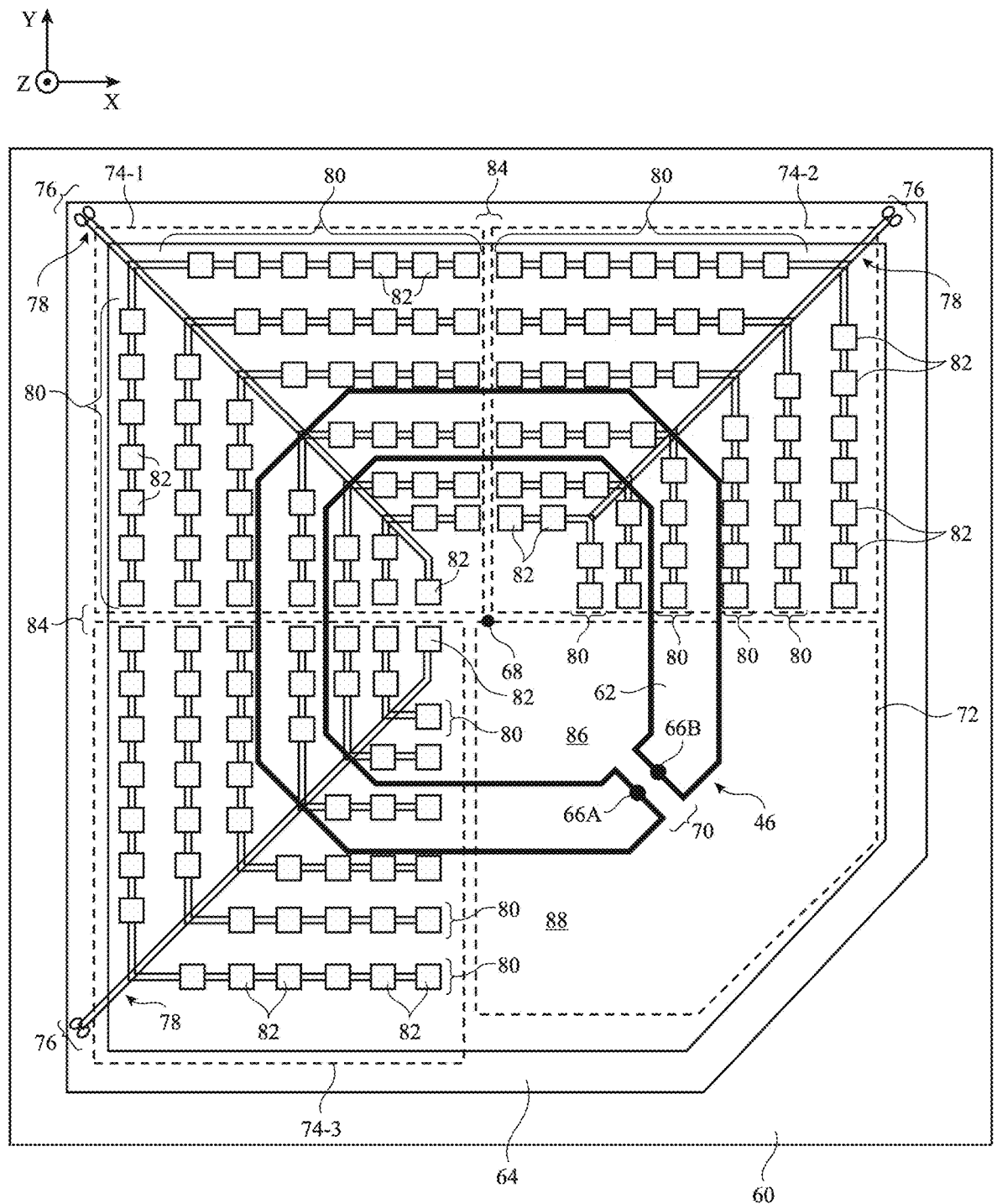
FIG. 4 is a layout diagram showing how illustrative tree circuits may be layered onto a substrate overlapping an inductor in accordance with some embodiments.

FIG. 4 is a top-down layout diagram showing one example of how substrate 60 may include capacitors overlapping inductor 46. As shown in FIG. 4, substrate 60 may include one or more circuit components 82. An implementation in which circuit components 82 are capacitors is described herein as an example. Circuit components 82 may therefore sometimes be referred to herein as capacitors 82. However, in general, circuit components 82 may include resistors, inductors, capacitors, ground traces, and/or any other desired circuits. Each capacitor 82 may be formed from respective patches of metal layered onto substrate 60 (e.g., layered onto two or more layers of substrate 60 different from the layer(s) of substrate 60 having conductive traces 62 of inductor 46). Each capacitor 82 may include two or more overlapping patches of metal (sometimes referred to herein as capacitor plates or capacitor electrodes) on substrate 60. The capacitor electrodes of each capacitor may be coupled to corresponding feed lines 78. Feed lines 78 may couple the capacitor to other components in device 10 via terminals 76. Capacitors 82 may have fixed capacitances or may be adjustable capacitors. Capacitors 82 may have capacitances less than or equal to 100 pF without degrading performance of inductor 46, for example.

Capacitors 82 may be used to form any desired capacitive components in device 10 (FIG. 1) such as capacitive components in transceiver circuitry 28, local oscillator 32, VCO circuitry 42, mixers 34, and/or front end circuitry 31. If desired, capacitors 82 may be used in the transmission and/or reception of radio-frequency signals. For example, capacitors 82 may be used to form impedance matching circuitry in front end circuitry 31 or transceiver circuitry 28, antenna tuning circuitry in front end circuitry 31, bypass capacitors 39 for power supply lines 37 or other bypass capacitors, part of a load for LDO regulator 48, part of loop filter 35 of PLL 29, capacitors in circuitry 58 of VCO circuitry 42 (FIG. 2), capacitors in a VCO core 42 (FIG. 2), coupling capacitors, and/or any other desired capacitive components in device 10.

If desired, capacitors 82 may be arranged into one or more capacitor circuits 74. Each capacitor circuit 74 may include a respective set of capacitors 82 that share the same feed lines 78. Each capacitor circuit 74 may include one, two, less than ten, more than ten, dozens, hundreds, thousands, or millions of capacitors 82. Capacitor circuits 74 may include any desired number of capacitors 82 coupled in series and/or in parallel with respect to feed lines 78. For example, capacitor circuits 74 may include trees of capacitors 82 that are each coupled to the same feed lines 78 in parallel with respect to each other. Capacitor circuits 74 may therefore sometimes be referred to herein as capacitor trees 74, trees 74, or tree circuits 74. The feed lines 78 and terminals 76 of each tree 74 may be coupled to the same input feed if desired.

If desired, the capacitors 82 within a given tree 74 may be physically arranged (laid out) in open-ended branches such as branches 80 (e.g., in a fishbone layout, structure, or configuration). Branches 80 may extend away from one or more feed lines 78. Each tree 74 may include a set of one or more branches 80 of capacitors 82. If desired, branches 80 may extending away from opposing sides of feed lines 78. This may, for example, serve to optimize the routing efficiency from the feed lines to each of the capacitors 82 in tree 74, which may also minimize the impact of the feed lines on the performance of inductor 46. Each branch 80 may include any desired number of one or more capacitors 82.

If desired, substrate 60 may include multiple trees 74 overlapping inductor 46. For example, as shown in FIG. 4, substrate 60 may include a first tree 74-1, a second tree 74-2, and a third tree 74-3 overlapping different respective portions or corners of inductor 46. The branches 80 of tree 74-3 may be laterally separated from the branches 80 of tree 74-1 by a corresponding gap 84 and the branches 80 of tree 74-1 may be laterally separated from the branches 80 of tree 74-2 by a corresponding gap 84.

If desired, a region 72 of substrate 60 may be free from capacitors 82. Region 72 may overlap terminals 66A and 66B of inductor 46, for example. Region 72 may serve to minimize the impact of the capacitors on the performance of inductor 46 and/or may accommodate the presence of other components such as a VCO core on substrate 60. However, if desired, substrate 60 may include a fourth tree 74 overlapping region 72 (e.g., having respective feed lines 78 extending radially outward from central axis 68 and through gap 70) or one or more of trees 74-1, 74-2, and 74-3 may be extended to fill region 72.

If care is not taken, the magnetic field produced by current flowing through inductor 46 can produce undesirable eddy currents on the capacitors 82 and feed lines 78 on substrate 60. These eddy currents may undesirably deteriorate the performance of inductor 46 and/or capacitors 82. Arranging capacitors 82 into multiple trees 74 having open ended branches 80 may serve to break up any potential current loop paths in the metal layers used to form the capacitors, preventing the formation of eddy currents. Since the branches 80 of capacitors 82 in each tree 74 are not electrically connected to the branches 80 of capacitors 82 in the other trees 74 on substrate 60 (due to the presence of gaps 84), there are no current loop paths formed by the metallization layers used to feed and form capacitors 82, which serves to prevent the formation of eddy currents. In this way, capacitors 82 may be used to perform other functions in device 10 (e.g., to convey radio-frequency signals) while also allowing substrate 60 to meet fill factor requirements and while minimizing deterioration in the performance of inductor 46 and/or capacitors 82 from eddy currents.

As shown in FIG. 4, tree 74-1 may be fed by feed lines 78 extending radially outwards from central axis 68 of inductor 46 at a location opposite to feed terminals 66A and 66B (e.g., at an angle 180 degrees from feed terminals 66A and 66B about central axis 68). At the same time, tree 74-3 and tree 74-2 may be fed by feed lines 78 extending radially outwards from central axis 68 at locations perpendicular to feed terminals 66A and 66B and the feed lines 78 of tree 74-1 (e.g., at angles 90 degrees from feed terminals 66A and 66B about central axis 68). Inductor 46 may exhibit minimal sensitivity at these locations with respect to feed terminals 66A and 66B. As such, feeding trees 74-1, 74-2, and 74-3 at these locations may serve to minimize the impact of capacitors 82 on the operation of inductor 46. While capacitors 82 are not shown as overlapping ground traces 64 in FIG. 4 for the sake of clarity, capacitors 82 may also overlap ground traces 64 if desired.

Figure 5:
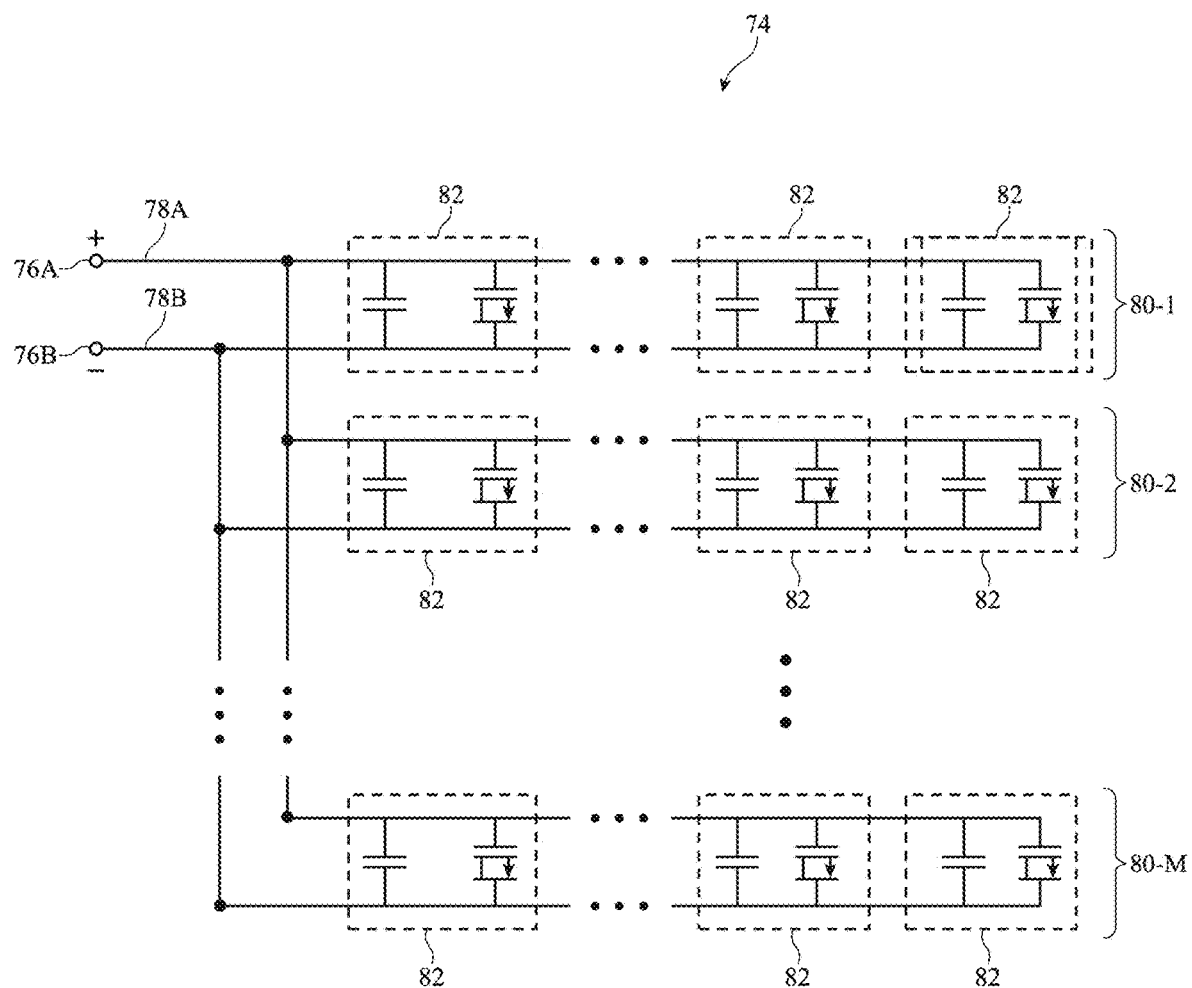
FIG. 5 is a circuit diagram of an illustrative tree of capacitors that may be layered onto a substrate overlapping an inductor in accordance with some embodiments.

FIG. 5 is a circuit diagram showing the capacitors 82 of a given tree 74. As shown in FIG. 5, feed lines 78 may include a first feed line 78A and a second feed line 78B. If desired, feed lines 78 may include additional feed lines such as control lines, reference voltage lines, or other lines that are coupled to and/or that are used to control capacitors 82. Feed line 78A may be coupled to a first terminal 76A. Feed line 78B may be coupled to a second terminal 76B.

Each capacitor 82 in tree 74 may be coupled to feed lines 78A and 78B in parallel. Each capacitor 82 may have at least a first capacitor electrode (e.g., a first metal plate or patch on substrate 60) coupled to feed line 78A and a second capacitor electrode (e.g., a second metal plate or patch on a different layer of substrate 60) coupled to feed line 78B. The capacitors 82 in tree 74 may be arranged into M branches 80.

Each branch may have the same number of capacitors or may have different numbers of capacitors. Each capacitor 82 may be coupled between feed lines 78A and 78B in parallel with each of the other capacitors 82 of the same branch 80 and of the other branches 80 of tree 74.

Figure 6:
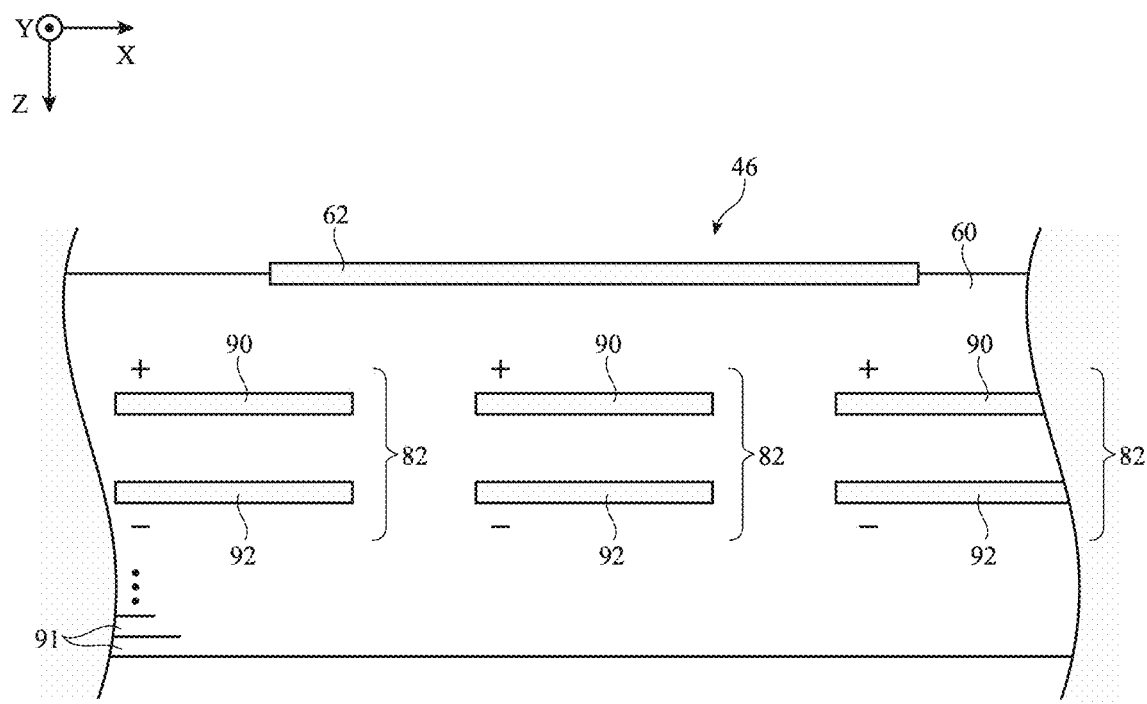
FIG. 6 is a cross-sectional side view showing how illustrative capacitors in a tree of capacitors and an inductor may be distributed across multiple layers of a substrate in accordance with some embodiments.

FIG. 6 is a cross-sectional side view showing how capacitors 82 and inductor 46 may be distributed across different layers 91 of substrate 60. As shown in FIG. 6, conductive traces 62 of inductor 46 may be patterned onto a first layer 91 of substrate 60. The first layer 91 may be an outermost (e.g., uppermost or lowermost) layer of substrate 60. This is illustrative and, if desired, additional layers 91 may be layered over or under the first layer 91.

Each capacitor 82 may include at least a first capacitor electrode 90 formed from a conductive trace layered onto a second layer 91 of substrate 60 and a second capacitor electrode 92 formed from a conductive trace layered onto a third layer 91 of substrate 60. The first capacitor electrodes 90 may be coupled to feed line 78A whereas the second capacitor electrodes 92 may be coupled to feed line 78B of FIG. 5, for example. The feed lines may include conductive traces on the second and third layers 91 of substrate 60 but are not shown in FIG. 6 for the sake of clarity.

Some capacitors 82 may completely overlap conductive traces 62 (e.g., when viewed in the −Z direction), some capacitors 82 may partially overlap conducive traces 62, and/or some capacitors 82 may be non-overlapping with respect to conductive traces 62. In the example of FIG. 6, each capacitor 82 includes only two capacitor electrodes. If desired, capacitors 82 may include more than two capacitor electrodes (e.g., distributed across three or more layers 91 of substrate 60).

Figure 7:
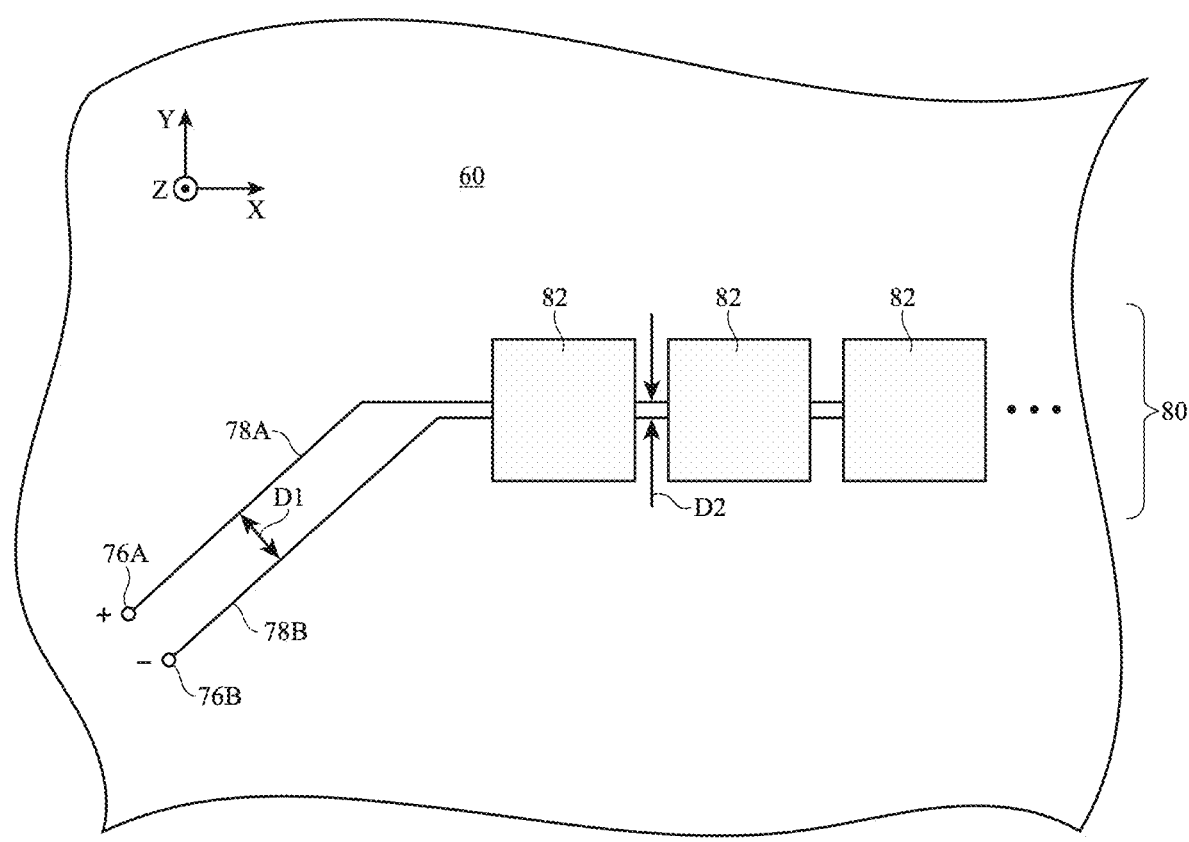
FIG. 7 is a top view showing how illustrative feed lines for capacitors in a tree of capacitors may be narrowed to minimize eddy current in accordance with some embodiments.

In practice, it may be desirable for feed lines 78 to be as close together as possible at capacitors 82 to minimize the size of any conductive loops overlapping the inductor (thereby minimizing eddy current). FIG. 7 is a top view showing how feed lines 78 for capacitors 82 in a branch 80 of a given tree 74 may be narrowed at capacitors 82. As shown in FIG. 7, feed lines 78A and 78B may be laterally separated by distance D1 at terminals 76A and 76B. Feed lines 78A and 78B may laterally narrow to be separated by distance D2 at the capacitors 82 in a given branch 80. Distance D2 may be less than distance D1. If desired, distance D2 may be zero (e.g., feed lines 78A and 78B may overlap each other and capacitors 82 on substrate 60). Narrowing feed lines 78 at capacitors 82 in this way may serve to minimize loop area and thus eddy current overlapping inductor 46, for example.

In the example of FIG. 4, capacitors 82 overlap the conductive traces 62 of inductor 46, the region 86 of substrate 60 laterally surrounded by conductive traces 62, and the region 88 of substrate 60 that is laterally interposed between conductive traces 62 and ground traces 64. This is illustrative and non-limiting. If desired, the capacitors 82 in trees 74 that overlap conductive traces 62 may be omitted, as shown in the example of FIG. 8.

Figure 8:
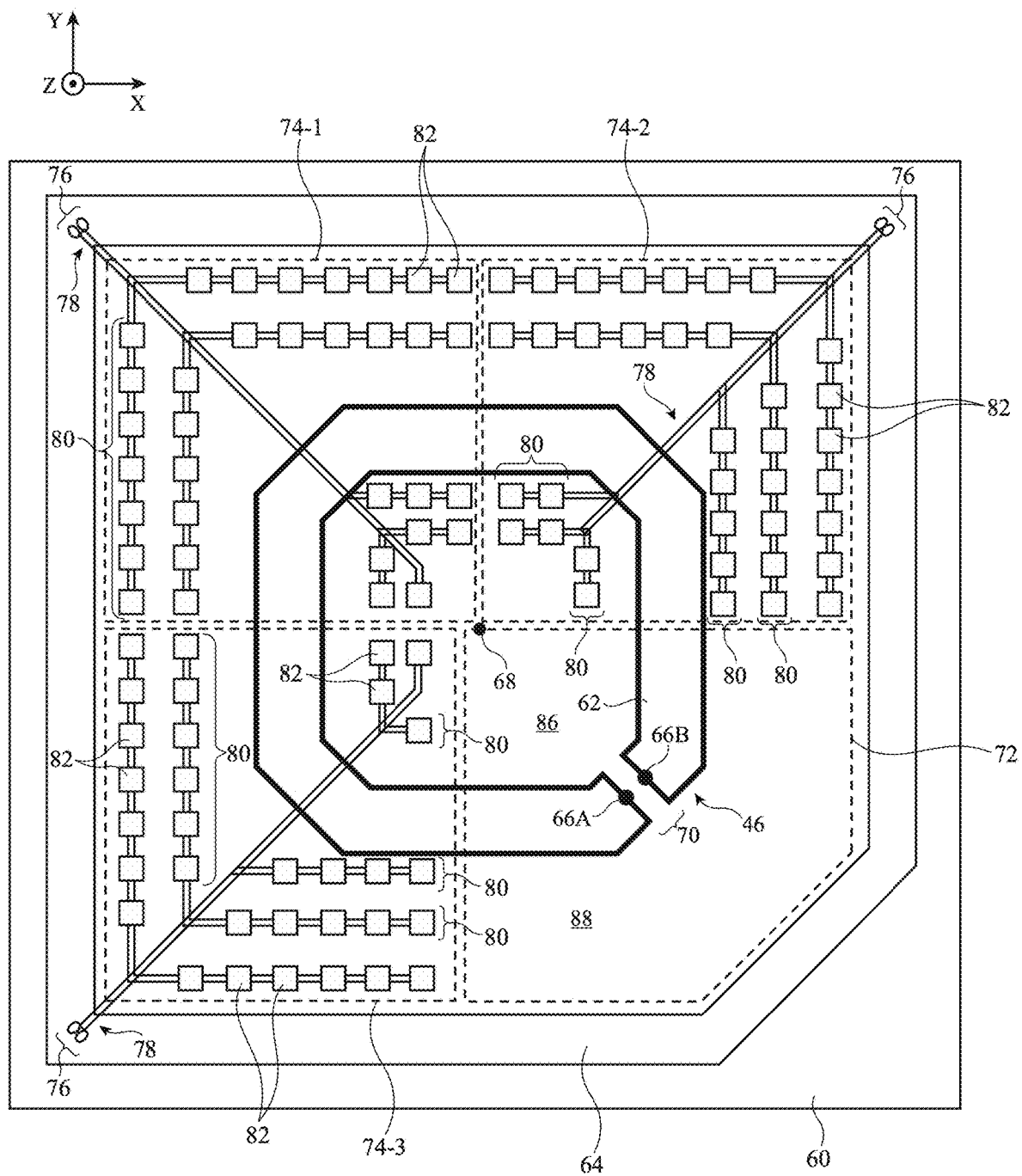
FIG. 8 is a layout diagram showing how illustrative tree circuits may overlap a first region of the substrate surrounding an inductor and a second region of the substrate surrounded by the inductor in accordance with some embodiments.

As shown in FIG. 8, trees 74-1, 74-2, and 74-3 may each include branches 80 of capacitors 82 that overlap region 86 and region 88 of substrate 60 but do not include branches 80 of capacitors that overlap conductive traces 62 (e.g., the capacitors 82 in trees 74-1, 74-2, and 74-3 of FIG. 8 are non-overlapping with respect to conductive traces 62). This may serve to further minimize the impact of capacitors 82 on the performance (e.g., Q-factor) of inductor 46 relative to implementations where capacitors 82 overlap conductive traces 62 (as shown in FIG. 4). If desired, substrate 60 may include a fourth tree 74 overlapping region 72 (e.g., having respective feed lines 78 extending radially outward from central axis 68 and through gap 70 and having capacitors 82 that overlap regions 86 and 88 but not conductive traces 62) or one or more of trees 74-2 and 74-3 may be extended to fill region 72.

Figure 9:
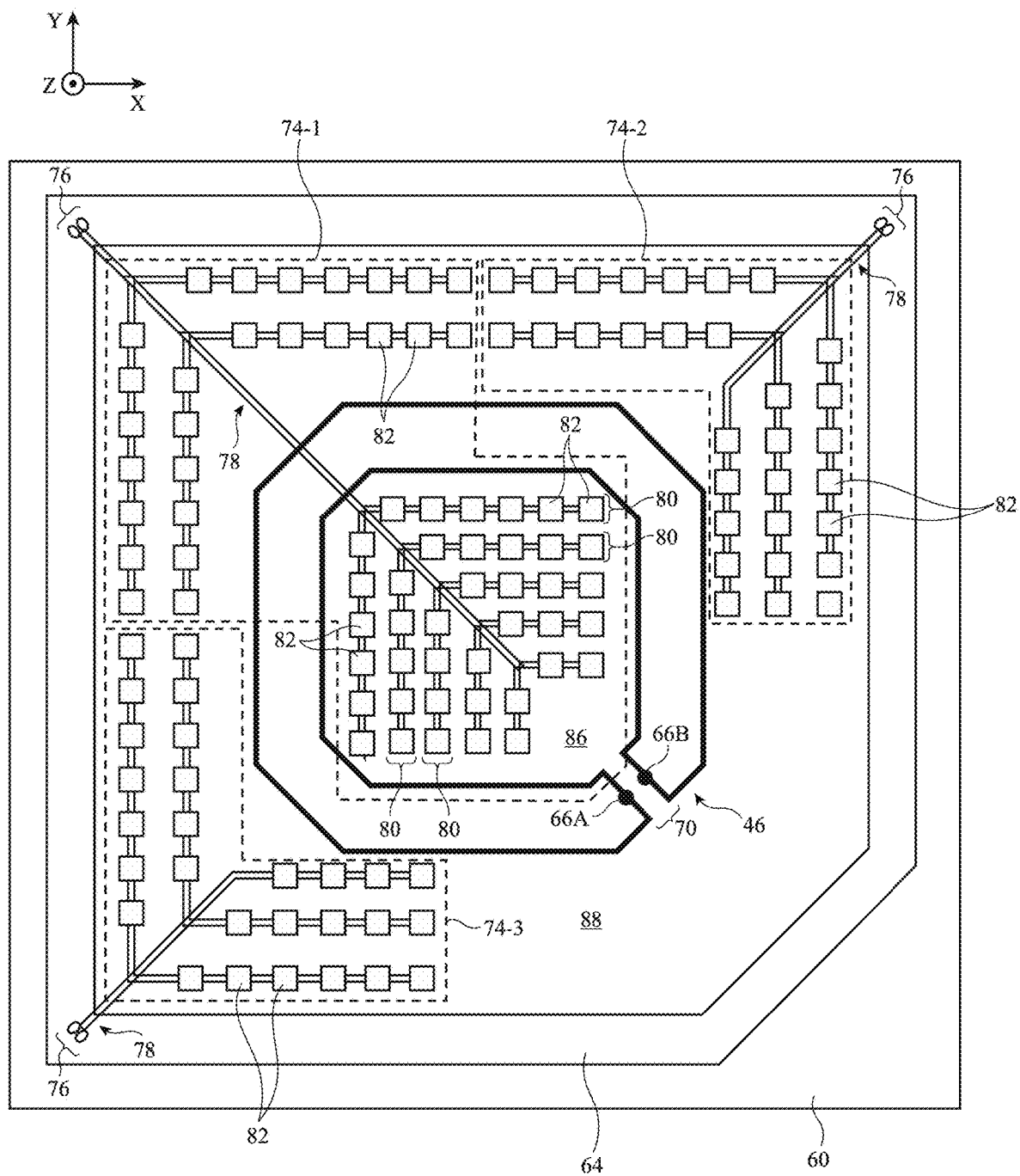
FIG. 9 is a layout diagram showing how an illustrative tree circuit may overlap a first region of the substrate surrounding an inductor and may fill a second region of the substrate surrounded by the inductor in accordance with some embodiments.

In the example of FIG. 8, each of trees 74-1, 74-2, and 74-3 include capacitors 82 overlapping region 86 of substrate 60. If desired, the capacitors in trees 74-2 and 74-3 overlapping region 86 may be omitted and tree 74-1 may include capacitors 82 that fill region 86 of substrate 60, as shown in the example of FIG. 9. As shown in FIG. 9, tree 74-1 may include branches 80 of capacitors 82 that overlap region 86. The branches 80 of capacitors 82 in tree 74-1 may fill region 86 (e.g., may overlap all or substantially all of region 86). This may serve to tweak the frequency response of inductor 46, for example.

Capacitors 82 as described herein may be replaced with any desired on-chip circuits or circuit components (e.g., printed inductors, capacitors, resistors, routing traces, ground traces, etc.). As such, trees 74 need not include capacitors. The circuit components (e.g., capacitors 82) arranged in trees 74 may be coupled to one or more feed lines 78. The fishbone distribution and layout of trees 74 as described herein serve to prevent the formation of large current loops on substrate 60, thereby preventing the formation of undesirable eddy currents during the operation of inductor 46.

Figure 10:
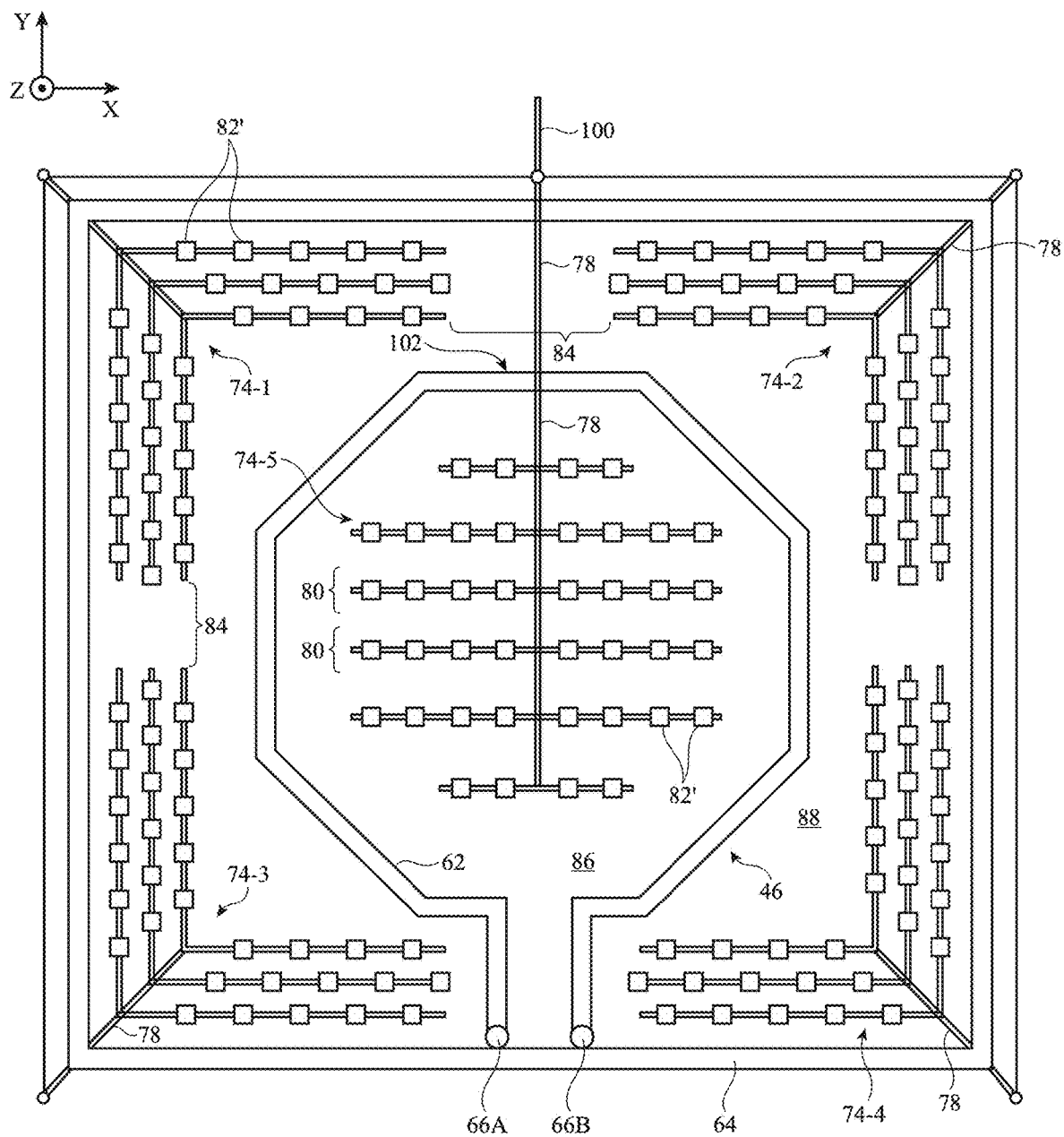
FIGS. 10-12 are layout diagrams showing how an illustrative tree circuit may be fed over a virtual ground point of an inductor having one or more turns in accordance with some embodiments.

If desired, one or more trees 74 may be fed under the virtual ground point of inductor 46. FIG. 10 is a layout diagram showing one example of how a tree 74 may be fed under the virtual ground point of inductor 46. As shown in FIG. 10, there may be multiple trees 74 of circuit components 82' (e.g., capacitors, inductors, resistors, etc.) such as trees 74-1, 74-2, 74-3, 74-4, and 74-5. Each tree 74 may include one or more feed lines 78 coupled to an input feed 100. Inductor 46 may have a virtual ground point 102 (e.g., opposite terminals 66).

In this example, trees 74-1, 74-2, 74-3, and 74-4 overlap region 88 but not region 86. The branches of tree 74-5 extend in a fishbone pattern from opposing sides of the feed line 78 of tree 74-5 and overlap region 86 (e.g., at the interior of inductor 46). The gaps 84 between trees 74 may serve to prevent the formation of conductive loops and thus minimize eddy current. The feed line 78 of tree 74-5 may overlap virtual ground point 102. This may serve to minimize impact of the feed line 78 of tree(s) 74 on the performance of inductor 46.

Figure 11:
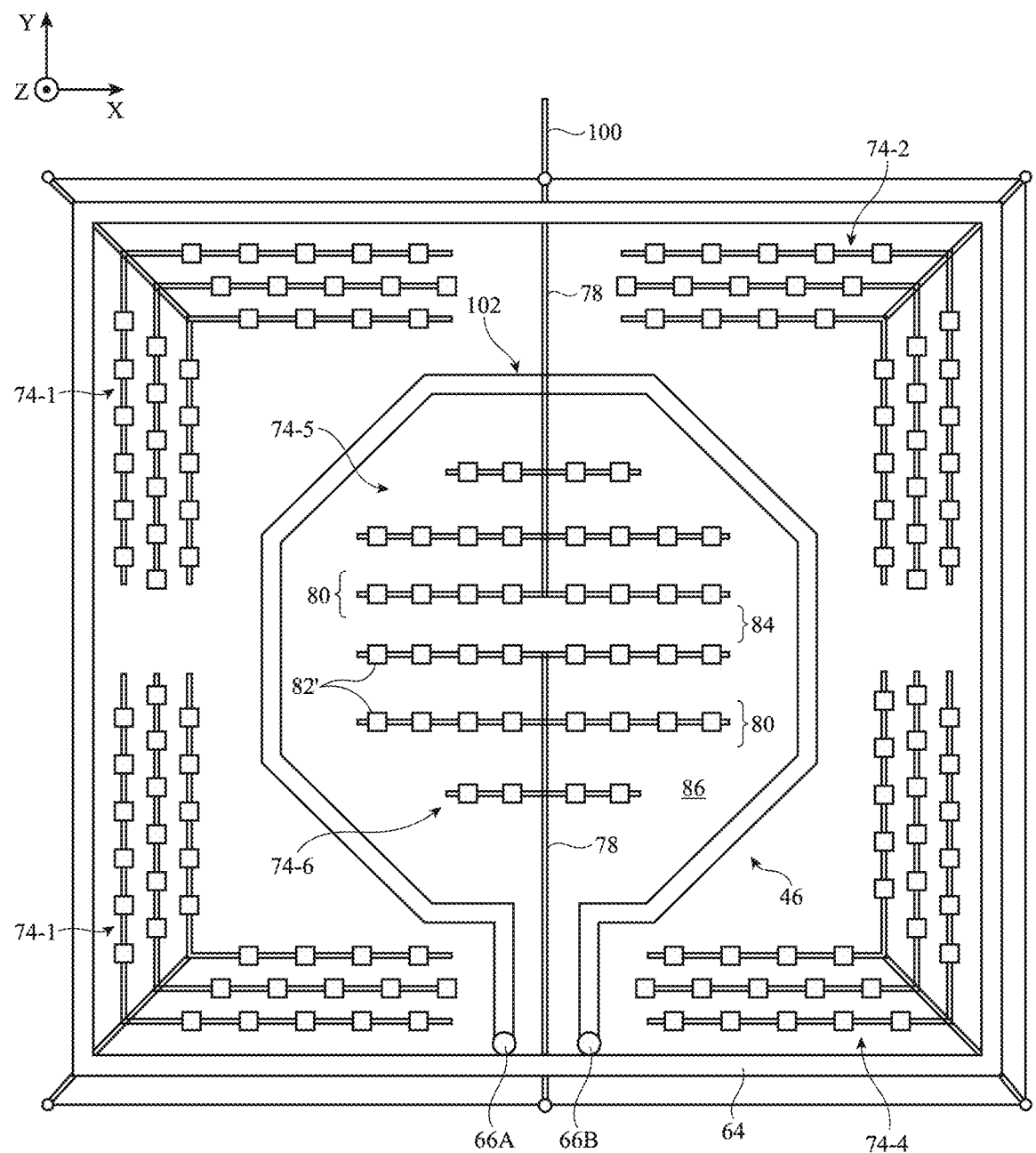

If desired, an additional tree 74-6 may be provided overlapping inductor 46, as shown in the layout diagram of FIG. 11. As shown in FIG. 11, tree 74-6 may be fed by a feed line 78 that passes between terminals 66A and 66B of inductor 46. This may minimize the impact of trees 74 on the performance of inductor 46. In the examples of FIGS. 4, 8, 9, 10, and 11, inductor 46 is illustrated as including only a single turn or winding of conductive traces 62 for the sake of clarity.

Figure 12:
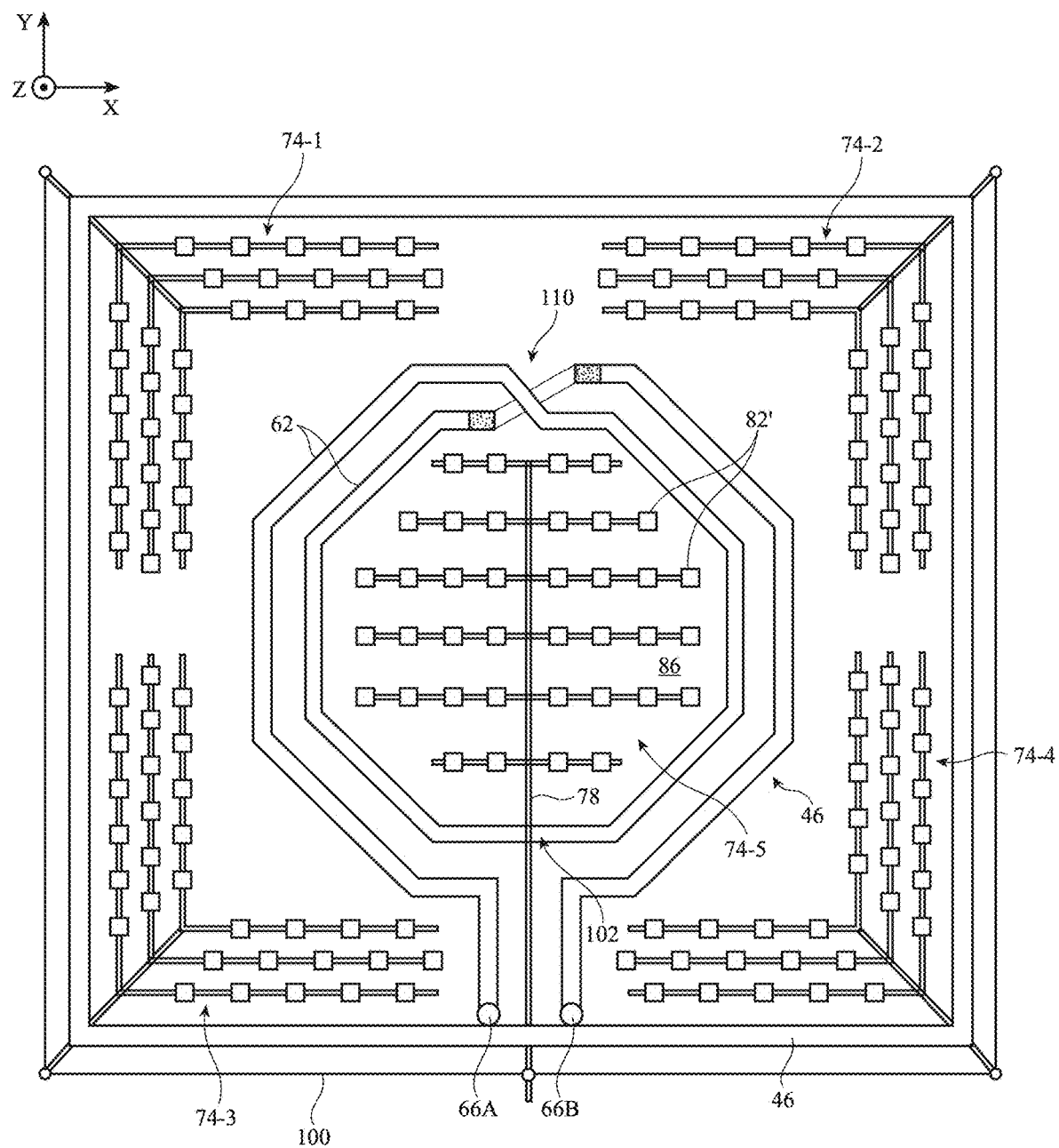

If desired, inductor 46 may include multiple turns, as shown in the example of FIG. 12. As shown in FIG. 12, the conductive traces 62 of inductor 46 may wrap multiple times about region 86. Inductor 46 may have a crossover point 110 (e.g., opposite terminals 66). This may move the location of virtual ground point 102 relative to when the inductor includes a single turn. Tree 74-5 may be fed by a feed line 78 that passes over virtual ground point 102 (e.g., over the ground metal and between terminals 66 of inductor 46). When laid out in this way, the feed line 78 for tree 74-5 passes over conductive traces 62 in inductor 46 only once rather than twice. Feeding tree 74-5 from elsewhere would cause feed line 78 to pass over conductive traces 62 more than once, which would produce a conductive loop and undesirable eddy currents. As such, feeding tree 74-5 in this way may serve to minimize impact of the feed line 78 of tree(s) 74 on the performance of inductor 46. In general, tree 74-5 may be fed over wherever the virtual ground point of inductor 46 is located given and/or such that the feed line for tree 78 passes over inductor 46 only once given the geometry of inductor 46.

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Circuitry comprising:
    a substrate;
    an inductor layered on the substrate, wherein the inductor comprises a loop that laterally surrounds a first region of the substrate;
    a ring of ground traces on the substrate and extending around the inductor and a second region of the substrate, the ring of ground traces being laterally separated from the inductor by the second region of the substrate;
    first capacitors layered on the substrate and overlapping the second region of the substrate; and
    second capacitors layered on the substrate and overlapping the first region of the substrate.

2. The circuitry of claim 1, further comprising:
    a first feed line on the substrate; and
    a second feed line on the substrate, the first capacitors and the second capacitors being coupled in parallel between the first feed line and the second feed line.

3. The circuitry of claim 2, further comprising:
    a third feed line on the substrate;
    a fourth feed line on the substrate, wherein the first feed line and the second feed line extend at a first angle with respect to a central axis of the inductor and the third feed line and the fourth feed line extend at a second angle with respect to the central axis, the second angle being different from the first angle;
    third capacitors layered on the substrate and overlapping the second region; and
    fourth capacitors layered on the substrate and overlapping the first region, the third capacitors and the fourth capacitors being coupled in parallel between the third feed line and the fourth feed line.

4. The circuitry of claim 2, further comprising:
    third capacitors layered on the substrate and overlapping the inductor, the third capacitors being coupled in parallel with the first capacitors and the second capacitors between the first feed line and the second feed line.

5. The circuitry of claim 2, wherein the first feed line extends from a first terminal to the first capacitors, the second feed line extends from a second terminal to the first capacitors, the first feed line is separated from the second feed line by a first distance at the first and second terminals, and the first feed line is separated from the second feed line by a second distance less than the first distance at the first capacitors.

6. The circuitry of claim 1, further comprising:
    a power supply line, wherein the first capacitors comprise a bypass capacitor for the power supply line.

7. The circuitry of claim 1, further comprising:
    a low-dropout regulator on the substrate, wherein the low-dropout regulator has a load that includes the first capacitors.

8. The circuitry of claim 1, further comprising:
    impedance matching circuitry that includes the first capacitors.

9. The circuitry of claim 1, further comprising:
    a phase-locked loop (PLL) on the substrate, wherein the PLL has a loop filter that includes the first capacitors.

10. The circuitry of claim 1, further comprising:
    a voltage controlled oscillator (VCO) on the substrate, wherein the VCO has a VCO core coupled to terminals of the inductor.

11. The circuitry of claim 1, further comprising:
    a feed line on the substrate and coupled to the first capacitors, wherein the feed line overlaps a virtual ground point of the inductor.

12. The circuitry of claim 1, wherein the first capacitors comprise:
    first electrodes on a first layer of the substrate; and
    second electrodes on a second layer of the substrate, wherein the second layer is stacked on the first layer and wherein the second electrodes overlap the first electrodes.

13. A radio-frequency transceiver configured to convey radio-frequency signals, the radio-frequency transceiver comprising:
    a substrate;
    an inductor on the substrate and laterally extending around a region of the substrate;
    a feed line on the substrate and overlapping the inductor and the region of the substrate, the feed line extending radially away from a central axis of the inductor; and
    circuit components on the substrate and overlapping the region of the substrate, the circuit components being coupled to the feed line and being arranged in branches extending from opposing sides of the feed line.

14. The radio-frequency transceiver of claim 13, wherein the feed line overlaps a virtual ground point of the inductor.

15. The radio-frequency transceiver of claim 14, wherein the inductor extends from a first terminal to a second terminal, the second terminal is separated from the first terminal by a gap, and the feed line overlaps the inductor opposite the gap.

16. The radio-frequency transceiver of claim 13, wherein the inductor extends from a first terminal to a second terminal, the second terminal is separated from the first terminal by a gap, and the feed line overlaps the gap.

17. The radio-frequency transceiver of claim 16, wherein the inductor has multiple turns and the inductor has a crossover point opposite the first and second terminals.

18. An electronic device comprising
- a transceiver configured to convey radio-frequency signals and having a substrate;
- an inductor on the substrate and laterally extending around a central axis from a first terminal to a second terminal;
- a first tree of circuit components on the substrate and arranged in branches extending from opposing sides of a first feed line, the first feed line extending radially away from the central axis at a first angle; and
- a second tree of circuit components on the substrate and arranged in branches extending from opposing sides of a second feed line, the second feed line extending radially away from the central axis at a second angle that is different from the first angle.

19. The electronic device of claim 18, further comprising:
- a ring of ground traces on the substrate and laterally surrounding the inductor, wherein the inductor surrounds a first region of the substrate, the ring of ground traces is separated from the inductor by a second region of the substrate, at least some of the circuit components in the first tree of circuit components overlap the second region of the substrate, at least some of the circuit components in the first tree of circuit components overlap the first region of the substrate, and at least some of the circuit components in the second tree of circuit components overlap the second region of the substrate.

20. The electronic device of claim 18, wherein the second terminal is separated from the first terminal by a gap, the first feed line overlaps the gap, and the second feed line overlaps the inductor opposite the gap.

* * * * *